United States Patent
Zhang et al.

(10) Patent No.: US 10,157,833 B1
(45) Date of Patent: Dec. 18, 2018

(54) VIA AND SKIP VIA STRUCTURES

(71) Applicant: GLOBALFOUNDRIES INC., Grand Cayman (KY)

(72) Inventors: Xunyuan Zhang, Albany, NY (US); Dongfei Pei, Schenectady, NY (US); Frank W. Mont, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/602,801

(22) Filed: May 23, 2017

(51) Int. Cl.
| | |
|---|---|
| *H01L 29/40* | (2006.01) |
| *H01L 23/528* | (2006.01) |
| *H01L 21/033* | (2006.01) |
| *H01L 21/311* | (2006.01) |
| *H01L 21/768* | (2006.01) |
| *H01L 21/288* | (2006.01) |
| *H01L 23/532* | (2006.01) |
| *H01L 23/522* | (2006.01) |

(52) U.S. Cl.
CPC ........ *H01L 23/528* (2013.01); *H01L 21/0332* (2013.01); *H01L 21/288* (2013.01); *H01L 21/31111* (2013.01); *H01L 21/76802* (2013.01); *H01L 21/76877* (2013.01); *H01L 23/5226* (2013.01); *H01L 23/53209* (2013.01); *H01L 23/53238* (2013.01); *H01L 23/53242* (2013.01)

(58) Field of Classification Search
CPC .................................................. H01L 21/0332
See application file for complete search history.

(56) References Cited

U.S. PATENT DOCUMENTS

| | | | |
|---|---|---|---|
| 6,852,635 B2 | 2/2005 | Satta et al. | |
| 2006/0289202 A1 | 12/2006 | Takeuchi et al. | |
| 2013/0234336 A1* | 9/2013 | Richter | ................ H01L 23/485 |
| | | | 257/774 |
| 2015/0170961 A1 | 6/2015 | Romero et al. | |
| 2015/0279772 A1 | 10/2015 | Inagaki et al. | |
| 2016/0056071 A1 | 2/2016 | Draeger et al. | |

FOREIGN PATENT DOCUMENTS

| | | |
|---|---|---|
| CN | 106463447 A | 2/2017 |
| KR | 100821456 B1 | 4/2008 |
| TW | 201635469 A | 10/2016 |

OTHER PUBLICATIONS

Taiwanese Notice of Allowance in related Taiwanese Application No. 106126251 dated Jun. 12, 2018, 4 pages.
Taiwanese Office Action in related Taiwanese Application No. 10720253010 dated Mar. 22, 2017, 4 pages.

* cited by examiner

*Primary Examiner* — Samuel Gebremariam
(74) *Attorney, Agent, or Firm* — Anthony Canale; Andrew M. Calderon; Roberts Mlotkowski Safran Cole & Calderon, P.C.

(57) ABSTRACT

The present disclosure generally relates to semiconductor structures and, more particularly, to via and skip via structures and methods of manufacture. The method includes: forming a plurality of openings in a hardmask material; blocking at least one of the plurality of openings of the hardmask material with a blocking material; etching a skip via to a metallization feature in a stack of metallization features through another of the plurality of openings which is not blocked by the blocking material; and at least partially filling the skip via by a bottom up fill process.

20 Claims, 6 Drawing Sheets

VIA AND SKIP VIA STRUCTURES

FIELD OF THE INVENTION

The present disclosure generally relates to semiconductor structures and, more particularly, to via and skip via structures and methods of manufacture.

BACKGROUND

A via is an electrical connection between wiring structures (e.g., wiring layers) in a physical electronic circuit that goes through the plane of one or more adjacent layers. For example, in integrated circuit design, a via is a small opening in an insulating oxide layer that allows a conductive connection between different wiring layers. A via connecting the lowest layer of metal to diffusion or poly is typically called a "contact".

In via technology, a skip via can be formed through many insulator layers, e.g., bypassing one or more wiring structures within the insulator layers, to connect with a lower wiring structure. This provides improved resistance characteristics, minimizes capacitance for a lower wiring structure, e.g., at M0 layer, as well as provides area efficiencies in the chip manufacturing process.

There are many challenges to using skip vias. For example, in the manufacturing process, the skip via will land on a wiring structure in a lower level (e.g., M0 level), while the regular via will land on the wiring structure in an upper level (e.g., M1 or above level). Due to the skip via etching processes, though, damage can result at the interface between the wiring structure in the upper level and a via interconnect structure. That is, due to the different etch depths, the skip via etching process will result in surface damage to the upper wiring structure, e.g., copper (Cu) material. This damage causes higher resistivity which, in turn, decreases device performance. Further, there may be no protection for the underlying metal layer.

Metallization of the via structures, such as Cu metallization of via structures, presents other challenges. For example, during an electroless metallization, the via filling height may be different.

SUMMARY

In an aspect of the disclosure, a method comprises: forming a plurality of openings in a hardmask material; blocking at least one of the plurality of openings of the hardmask material with a blocking material; etching a skip via to a metallization feature in a stack of metallization features through another of the plurality of openings which is not blocked by the blocking material; and at least partially filling the skip via by a bottom up fill process.

In an aspect of the disclosure, a method comprises: forming a plurality of openings of different widths in a hardmask material; etching a first via at least partially into an underlying insulator layer, which will expose sidewalls of at least one of the openings of the hardmask material; etching a second via at least partially into an underlying insulator layer, which will land within at least another of the openings of the hardmask material; growing a blocking material on the exposed sidewalls of the at least one of the openings of the hardmask material to prevent continued via formation of the first via; extending the second via to form a skip via while the first via remains blocked by the blocking material, the second via being formed to a lower metallization feature; and at least partially filling the skip via by a bottom up fill process.

In an aspect of the disclosure, a structure comprises: a first wiring layer with one or more wiring structures; a second wiring layer above the first wiring layer, the second wiring layer including one or more wiring structures; a via structure comprising a conductive material extending to the one or more wiring structures of the second wiring layer; and a skip via structure extending through the second wiring layer and landing on the one or more wiring structures of the first wiring layer, the skip via comprising a first conductive metal in contact with the one or more wiring structures and a second conductive material in electrical contact with the first conductive material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to via and skip via structures and methods of manufacture. In embodiments, the processes provided herein use a blocking layer to delay via formation, while etching one or more skip via structures. By using the blocking layer it is now possible to tune the etch time and via profile by delaying the via etch for a regular via while simultaneously controlling an etch time for a skip via. By implementing the structures and processes described herein it is also possible to eliminate a masking level for patterning a skip via while still controlling the profiles of the regular vias. The elimination of a masking level will significantly decrease costs and manufacturing times.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
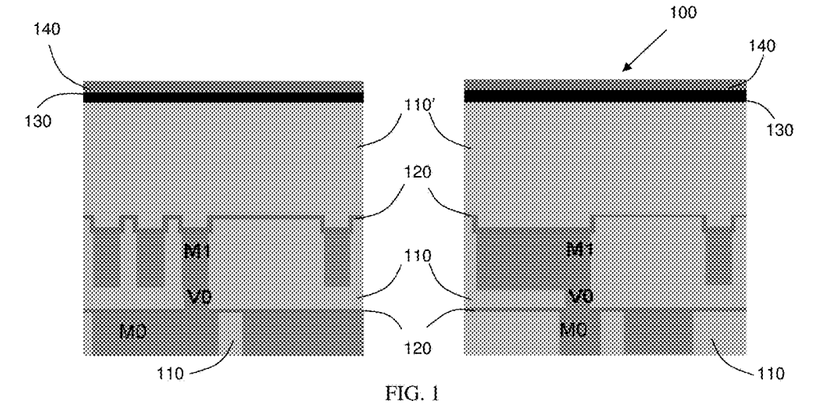
FIG. 1 shows a structure, amongst other features, and respective fabrication processes in accordance with aspects of the present disclosure.

FIG. 1 shows a structure and respective fabrication processes in accordance with aspects of the present disclosure. More specifically, FIG. 1 illustrates multiple views of a structure including in a self aligned via (SAV) direction 100. In embodiments, the structure comprises several interlevel dielectric (ILD) layers 110, 110' at different metallization layers of the structure, separated by a capping material 120. In embodiments, the ILD layers 110, 110' can be formed from an ultra low-k dielectric material or a low-k dielectric material including a dense oxide material or silicon nitride, amongst other materials. The capping material 120 can be a silicon nitride (SiN) material, amongst other materials.

In embodiments, the ILD layers 110, 110' can include metallization, i.e., wiring structures and vias. For example, the ILD layers 110 can include a bottommost metal layer M0 comprising wiring structures and an upper metal layer M1 comprising vias V0 connected to different wiring layers on different layers of the stacked structure. The metal layers M0, M1 can be formed by conventional lithography and etching techniques followed by deposition of a metal or metal alloy, e.g., copper or aluminum, etc. In embodiments, any residual metal on a surface of the ILD layer 110 can be removed by a chemical mechanical polishing (CMP) process.

As further shown in FIG. 1, a hardmask 130 and oxide layer 140 can be deposited on the uppermost ILD layer 110'. The hardmask 130 can be a TiN material deposited by any conventional deposition processes, e.g., physical vapor deposition (PVD) processes. Following the deposition of the hardmask 130, the oxide layer (hardmask) 140 is deposited on the hardmask 130 by a conventional deposition processes, e.g., chemical vapor deposition (CVD) processes.

Figure 2:
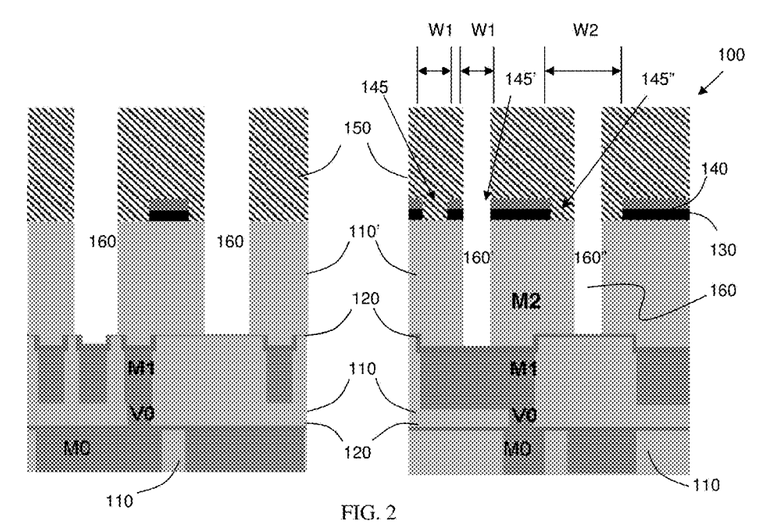
FIG. 2 shows vias extending to a capping layer, amongst other features, and respective fabrication processes in accordance with aspects of the present disclosure.

In FIG. 2, a plurality of openings 145, 145', 145" are formed within the hardmasks 130, 140 to expose portions of the ILD layer 110'. In embodiments, the openings 145, 145', 145" in the hardmasks 130, 140 are formed by conventional lithography and etching processes, e.g., reactive ion etching (RIE) with a selective chemistry. As shown in the SAV direction 100, the openings 145, 145', 145" in the hardmasks 130, 140 have different profiles, e.g., widths. Specifically, width W1 is smaller or narrower in comparison to width W2, which is wider than width W1. As should be understood by those of skill in the art, the different widths will provide control for subsequent etching process by allowing a selective growth of a blocking material.

Still referring to FIG. 2, an organic planarization layer (OPL) 150 is deposited on the hardmask 140. The OPL 150 can be deposited by conventional deposition processes, e.g., spin-on, which will form part of a lithographic stack used for subsequent etching of vias 160, 160', 160" at least partially into ILD layer 110', landing on the M1 layer and/or the capping material 120, i.e., the SiN material. In embodiments, the vias 160, 160', 160" are formed in the upper metallization layers, e.g., M1 and M2, by conventional etching processes as described herein, with selective chemistries.

As further shown in FIG. 2, the via 160' is aligned with the opening 145', exposing portions (sidewalls) of the TiN material; whereas, the via 160" is provided within or between the opening 145" having width W2, which will not expose any of the TiN material of the hardmask 130. In this way, blocking material can be grown selectively on the exposed portions of the TiN material of opening 145' to control etching processes in subsequent skip via formation.

Figure 3:
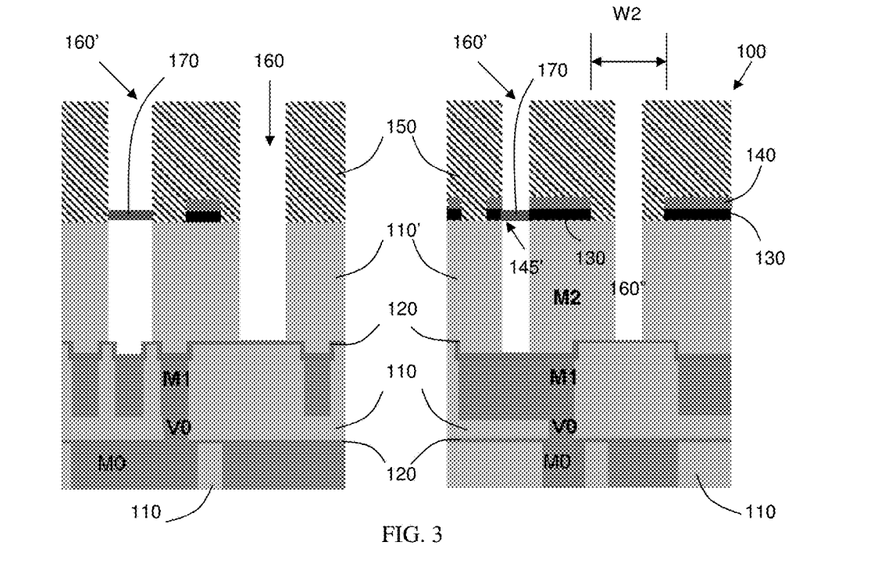
FIG. 3 shows a blocking layer grown on a metal material, amongst other features, and respective fabrication processes in accordance with aspects of the present disclosure.

FIG. 3 illustrates a blocking material 170 formed in the opening 145'. As should be understood by those of skill in the art, the blocking material 170 can be formed in more than one opening depending on exposure of the material in previous fabrication steps. In embodiments, the blocking material 170 can be cobalt (Co) or ruthenium (Ru), or other selective growth material which will grow on the exposed surfaces of TiN material of the hardmask 130 as shown in the SAV direction 100. In embodiments, the blocking material 170 will be grown within the via 160' used for a regular via; whereas, the blocking material 170 will not grow in the via 160", used for the skip via. That is, as should be understood by those of skill in the art, as the via 160" lands fully within the width W2, e.g., W2 has a width greater than the via 160" and does not expose any of TiN material of the hardmask 130. Therefore, there will be no growth of the blocking material 170 within the via 160".

Figure 4:
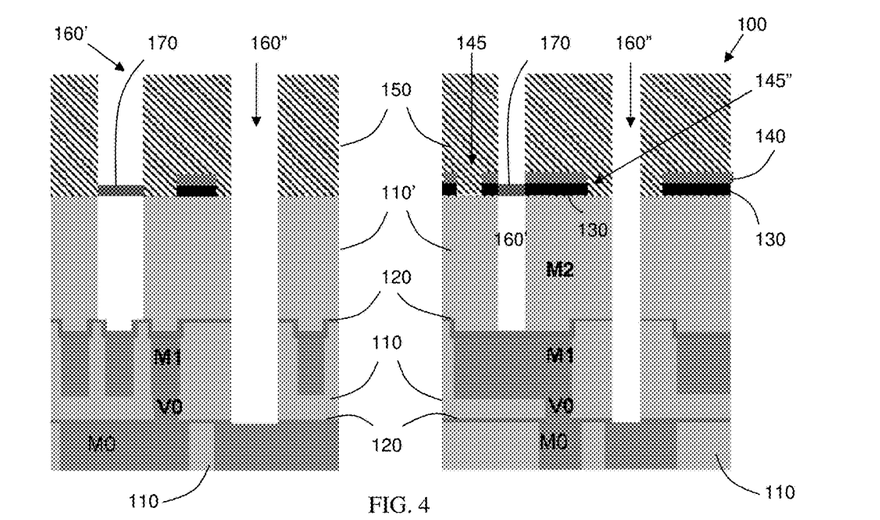
FIG. 4 shows a skip via, amongst other features, and respective fabrication processes in accordance with aspects of the present disclosure.

In FIG. 4, the via (skip via) 160" is extended (etched) to a lower wiring layer M0, landing on a metallization feature, i.e., lower metallization feature, by etching through the capping layer 120. In embodiments, the skip via 160" can be formed by conventional etching processes, e.g., reactive ion etching (RIE), to the ILD material and capping material 120. In this way, the etching processes will expose the underlying wiring layer M0, whereas, as should be understood by those of skill in the art, the blocking material 170 will prevent or delay the via 160' formation, e.g., from being etched further downwards during the skip via formation. That is, the blocking material 170 will protect the via 160' and hence will delay any etching of materials to extend from occurring which would expose the underlying metallization feature M1. In comparison, the via 160" not covered by the blocking material 170 will be further etched, extending through the M1 layer and landing on and exposing the M0 layer.

Figure 5:
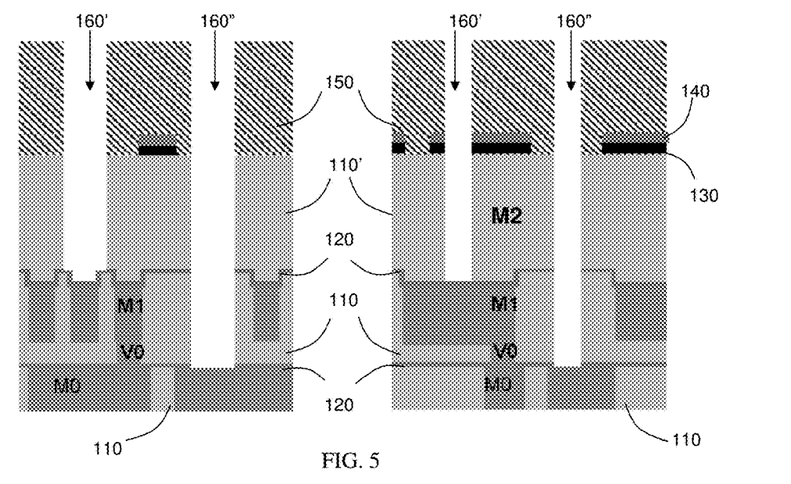
FIG. 5 shows a via at a first level and a skip via at a lower level of the structure, amongst other features, and respective fabrication processes in accordance with aspects of the present disclosure.

In FIG. 5, the blocking material 170 can be removed by a conventional dilute hydrochloric acid (dHF) process. This dHF process can also be used to clean any residual RIE material. As shown, though, the capping material (layer) 120 will remain over the metallization feature M1.

Figure 6:
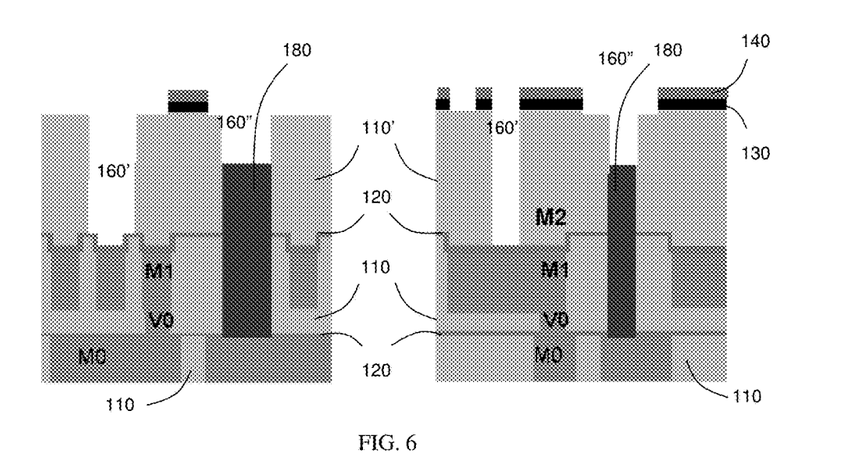
FIG. 6 shows a bottom-up filled material within the skip via, amongst other features, and respective fabrication processes in accordance with aspects of the present disclosure.

In FIG. 6, the OPL 150 is removed by a conventional oxygen ashing process or stripant. After the removal of the OPL 150, the skip via 160" can be partially filled using an electroless bottom up fill process. In embodiments, the fill process can be a Co electroless fill process, as represented by reference numeral 180. In alternative embodiments, the metal material can be Ru, amongst other materials, which can be grown from the exposed metallization feature, M0. As the capping layer 120 remains over the metallization feature M1, the metal fill process will not fill the via 160'.

Figure 7:
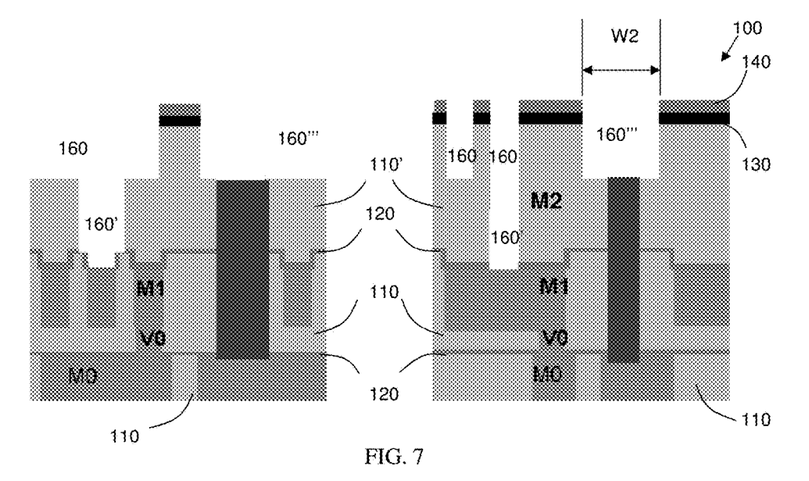
FIG. 7 shows a trench on top of the skip via, amongst other features, and respective fabrication processes in accordance with aspects of the present disclosure.

As shown in FIG. 7, a trench 160''' is formed on top of the skip via 160" for subsequent metal wiring deposition and trenches 160 can be formed in the ILD layer and connect with via 160'. These trenches 160 and 160''' are formed by RIE processes selective to the TiN hardmask 130. During the RIE process, the capping layer 120 below via 160' is opened.

In embodiments, the height of the fill material 180 can be controllable and adjusted based on the required final height of the metal material in the skip via 160". In embodiments, for example, the height of the fill material 180 can be at any height, with a preference of below or at a level of the bottom surface of the trench 160'". As a specific example, the height of the fill material 180 can be in a range of about 15 nm-200 nm. In embodiments, the fill process prevents pinch off and, hence, formation of air gaps in the fill material.

Figure 8:
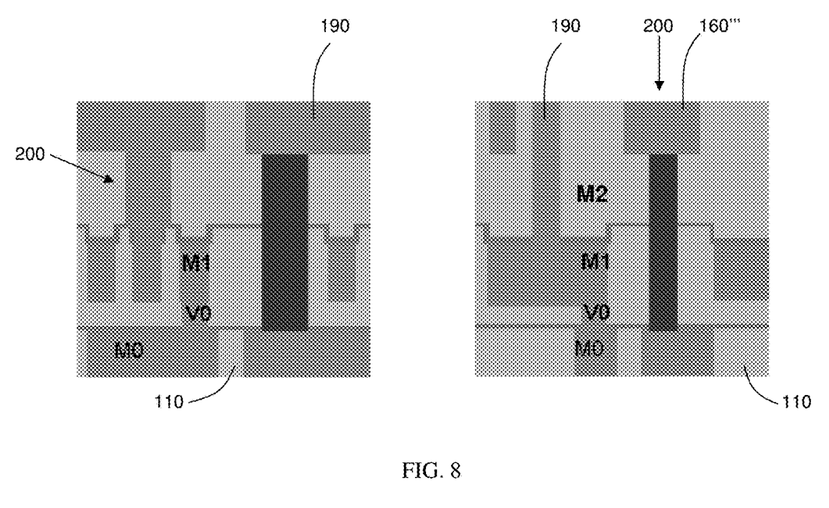
FIG. 8 shows a plurality of filled trenches and vias, amongst other features, and respective fabrication processes in accordance with aspects of the present disclosure.
Figure 9:
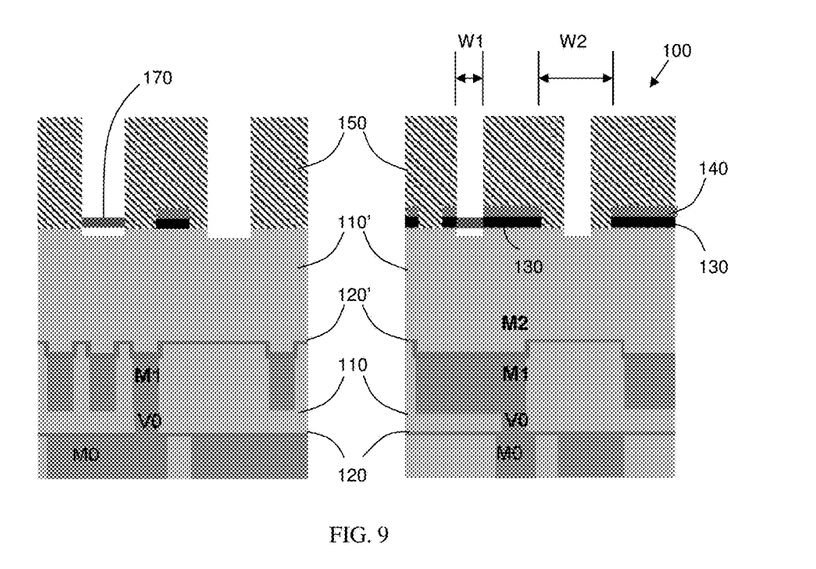
FIGS. 9-12 show respective structures and respective fabrication processes in accordance with alternative aspects of the present disclosure.

In FIG. 8, a metal material 190, e.g., metallization layer M2, fills the via structure 160' and the trenches 160 and 160'" (e.g., which is used as a wiring layer). The metal material 190 can be deposited by conventional deposition process, e.g., PVD, CVD and/or electroplating, followed by a CMP process to planarize the metal material 190. In embodiments, the metal material 190 can be composed of any suitable conductive material such as copper (Cu), amongst other examples. In embodiments, the metal material 190 will be in direct contact with the metal material of the skip via structure, represented by reference numeral 200.

Figure 10:
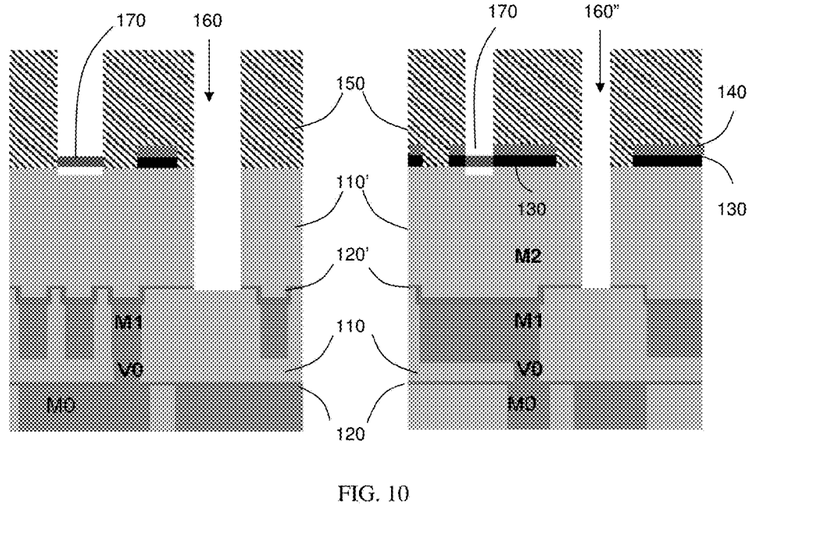

FIGS. 9-12 illustrate alternative embodiments in accordance with aspects of the present invention. In this alternative embodiment, the blocking material 170 is grown from the exposed TiN material of the hardmask 130, prior to the formation of any via structure in the ILD layers. As previously described and as should be understood by those of skill in the art, the blocking material 170 will selectively grow on the exposed TiN (or other material); while allowing further etching to be performed to form the skip via structure As shown in FIG. 10, a via 160" can be formed by an etching process to the underlying capping layer 120', to the metallization layer M1. The etching process can be a selective etching process to remove any intervening layers of material including, e.g., the ILD layers 110, 110' and capping materials 120, 120'. During this process, the blocking material 170 will prevent etching of a via to the metallization feature, M1, at other locations of the structure.

Figure 11:
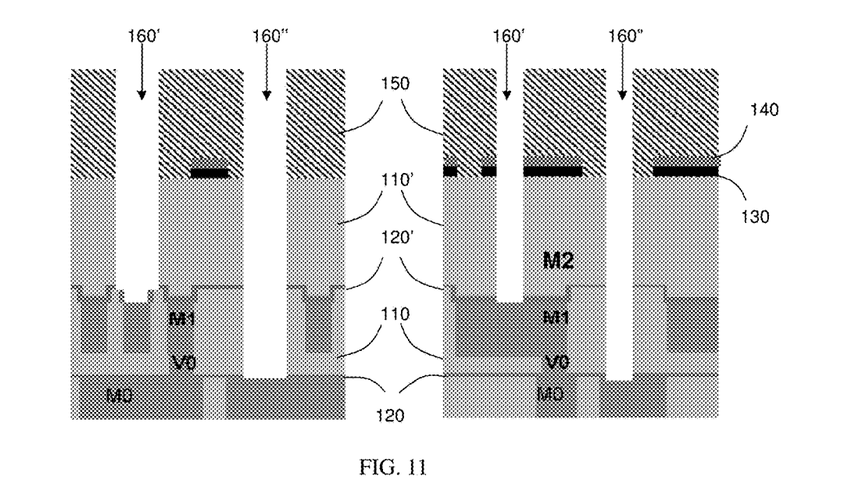

In FIG. 11, the blocking material 170 is removed and etching processes continue on both sides of the structure to form the via 160' and skip via 160". In this embodiment, the etching process is a selective etching process (e.g., RIE), which will expose the underlying metallization features at both levels, M0 and M1. More specifically, this etching process will remove the capping material 120, 120', exposing the metallization features at the different levels.

Figure 12:
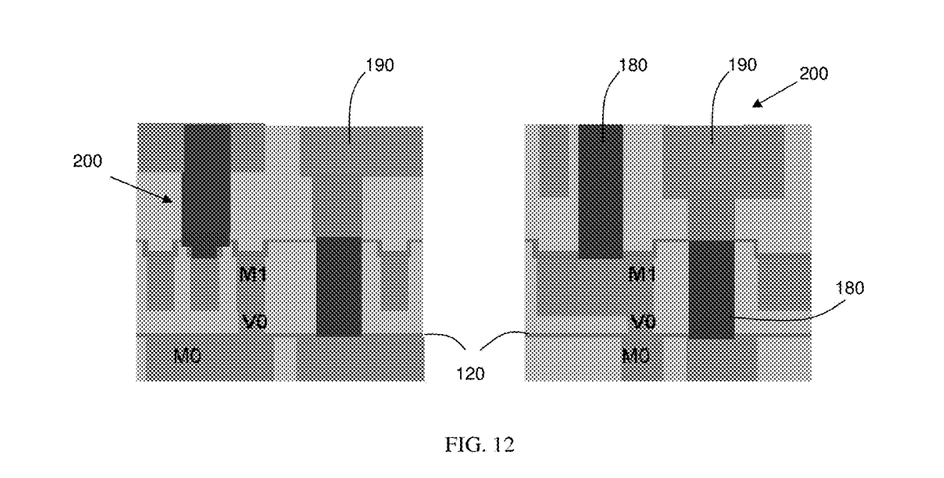

FIG. 12 continues with a RIE process to form the trenches 160 and 160'". A dual damascene structure is then formed and the via structures 160', 160" are filled by the electroless bottom up fill process, e.g., using Co or Ru. This is possible due to the fact that metallization features are exposed in both vias 160', 160". As previously discussed, a metal material 190, e.g., the upper metallization layer M2, fills the via structure 160' and the trenches 160 and 160'" (e.g., which are used as a wiring layer), followed by a CMP process to planarize the metal material 190. In embodiments, the metal material 190 can be composed of any suitable conductive material such as copper (Cu), amongst other examples. In embodiments, the metal material 190 will be in direct contact with the metal material of the skip via structure, represented by reference numeral 200, and regular via structure.

In embodiments, it is contemplated that instead of an electroless bottom up fill process, the vies can be filled by conventional metallization deposition processes, e.g., CVD Cu processes. It is also contemplated that any via can be filled with the electroless bottom up fill process, while other vies are filled with the copper (Cu) metallization, as shown in FIG. 7, or any combination thereof. In addition, as should be understood by those of skill in the art, etch times and via profiles to be tuned using the blocking material 170, while eliminating the need for multiple masks to form the ski via.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
forming a plurality of openings in a hardmask material;
blocking at least one of the plurality of openings of the hardmask material with a blocking material; and
etching a skip via to a metallization feature in a stack of metallization features through another of the plurality of openings which is not blocked by the blocking material, wherein the blocking material is formed on exposed portions of the hardmask material.

2. The method of claim 1, wherein the hardmask material is TiN.

3. The method of claim 1, further comprising at least partially filling the skip via by a bottom up fill process.

4. The method of claim 3, wherein the bottom up fill process is an electroless process and comprises filling the skip via with Co or Ru.

5. The method of claim 3, further comprising removing the blocking material and forming a via to an upper metallization feature above the metallization feature.

6. The method of claim 5, wherein the via is completely formed after the skip via is filled by the bottom up fill process.

7. The method of claim 6, wherein the completely forming of the via comprises etching through a capping layer to expose the upper metallization feature.

8. The method of claim 3, further comprising partially forming a via to a capping layer of an upper metallization feature above the metallization feature, prior to forming of the blocking material.

9. The method of claim 8, wherein the via is completely formed after the filling the skip via is filled by the bottom up fill process by etching through the capping layer to expose the upper metallization feature.

10. The method of claim 9, further comprising filling the via with material different than material used in the electroless bottom up fill process.

11. The method of claim 10, further comprising forming a trench on the skip via and filling the trench with a fill material, wherein a height of the fill material is below or at a level of a bottom surface of the trench.

12. The method of claim 1, wherein the another of the least one of the plurality of openings is wider than the at least one of the plurality of openings.

13. The method of claim 1, wherein the forming of the blocking material on the exposed portions of the hardmask material is a growth process.

14. The method of claim 13, wherein the forming a blocking material on the exposed sidewalls of the at least one of the openings of the hardmask material is a growth process.

15. A method comprising:
   forming a plurality of openings of different widths in a hardmask material;
   etching a first via at least partially into an underlying insulator layer, which will expose sidewalls of at least one of the openings of the hardmask material;
   etching a second via at least partially into the underlying insulator layer, which will land within at least another of the openings of the hardmask material;
   forming a blocking material on the exposed sidewalls of the at least one of the openings of the hardmask material to prevent continued via formation of the first via; and
   extending the second via to form a skip via while the first via remains blocked by the blocking material, the second via being formed to a lower metallization feature.

16. The method of claim 15, wherein the hardmask material is TiN.

17. The method of claim 16, further comprising at least partially filling the skip via by a bottom up fill process which is an electroless process.

18. The method of claim 17, further comprising removing the blocking material and continuing the formation of the first via to an upper metallization feature above the lower metallization feature.

19. The method of claim 18, wherein the first via is completely formed through a capping layer to expose the upper metallization feature, after the skip via is filled by the bottom up fill process.

20. The method of claim 19, further comprising filling the first via with material different than material used in the electroless bottom up fill process.

* * * * *